(12) United States Patent
Kishlock et al.

(10) Patent No.: US 6,785,620 B2
(45) Date of Patent: Aug. 31, 2004

(54) ENERGY EFFICIENCY MEASURING SYSTEM AND REPORTING METHODS

(75) Inventors: Teresa Kishlock, Murrysville, PA (US); Rand Warsaw, Monroeville, PA (US); Laura Lewis, Irwin, PA (US); Vijay Parmar, Pittsburgh, PA (US)

(73) Assignee: Weatherwise USA, LLC, Pittsburgh, PA (US)

( * ) Notice: Subject to any disclaimer, the term of this patent is extended or adjusted under 35 U.S.C. 154(b) by 205 days.

(21) Appl. No.: 09/779,266

(22) Filed: Feb. 8, 2001

(65) Prior Publication Data

US 2001/0020219 A1 Sep. 6, 2001

(51) Int. Cl.$^7$ ............................................. G06F 19/00
(52) U.S. Cl. ......................................................... 702/61
(58) Field of Search ........................ 702/61, 130, 199; 703/37, 10, 6; 340/540; 455/423, 422, 445; 440/2; 706/45; 705/417, 412; 60/652; 379/207; 514/539; 364/557, 512

(56) References Cited

U.S. PATENT DOCUMENTS

| | | | | |
|---|---|---|---|---|
| 4,391,826 A | * | 7/1983 | Mills et al. | 514/539 |
| 4,843,575 A | * | 6/1989 | Crane | 701/99 |
| 5,513,519 A | * | 5/1996 | Cauger et al. | 73/112 |
| 5,717,609 A | * | 2/1998 | Packa et al. | 702/130 |
| 5,812,422 A | | 9/1998 | Lyons | |
| 5,873,251 A | * | 2/1999 | Iino | 60/652 |
| 6,061,433 A | * | 5/2000 | Polcyn et al. | 379/207.15 |
| 6,088,688 A | | 7/2000 | Crooks et al. | |
| 6,134,511 A | | 10/2000 | Subbarao | |
| 6,169,979 B1 | | 1/2001 | Johnson | |

OTHER PUBLICATIONS

Declaration of Rand A. Warsaw dated Feb. 25, 2002.
Fels, M., "PRISM: An Introduction," Energy and Buildings, 9 (1986), pp. 5–18.
"Energy Advisor," printed from http://www.homeenergysaver.lbl.gov on Feb. 18, 2002.
"Estimated Annual Energy Bill for Average House," printed from http://hes2.lbl.gov/hes/db/zip.taf?f=top on Feb. 18, 2002.

* cited by examiner

Primary Examiner—John Barlow
Assistant Examiner—Tung S Lau
(74) Attorney, Agent, or Firm—Kirkpatrick & Lockhart LLP

(57) ABSTRACT

A method of providing energy efficiency changes to a plurality of energy consumers. The method includes calculating the energy efficiency changes for the consumers based on energy consumption histories and weather data, wherein the energy efficiency changes are calculated using individual data for each of the consumers. The method also includes reporting the energy efficiency changes to each of the consumers.

28 Claims, 4 Drawing Sheets

ENERGY EFFICIENCY MEASURING SYSTEM AND REPORTING METHODS

BACKGROUND OF THE INVENTION

1. Field of the Invention

The present invention is directed generally to a system and method for calculating changes in the energy efficiency of retail consumers of energy and reporting to those consumers and to other interested parties such as utilities, energy suppliers, regulators and other governmental agencies the results and ramifications of those changes.

2. Description of the Background

The cornerstone of an effective energy conservation program is the ability of the individual consumer to get a clear signal of the results of their energy conservation efforts and investments. For the vast majority of consumers, the only real measuring tool that signals the effect of their conservation efforts is their monthly utility bill. Their bill does not provide a clear signal due to changes in the weather and volatility in energy prices. Without clear feedback, consumers become less interested in attempting to control their energy usage, believing they have no control over their energy bill.

Only the largest consumers have been able to get a true understanding of the benefits of their conservation efforts through labor-intensive energy audits performed on a manual basis. Because of the high cost of these individual audits, it is not cost effective to perform them for retail consumers such as residential or small- to medium-sized commercial customers. The high cost of individual audits is driven by the need to manually process usage and weather data, individually deal with data deficiencies and to make manual adjustments for incomplete or inaccurate information. In manual audits, model selection occurs at the discretion of a human auditor, although there have been some attempts at automated model generation, such as the Prism approach, described in Fels, M., "PRISM: An Introduction", Energy and Buildings, 9 (1986), pp. 5–18.

Utilities may develop a prediction of a consumer's usage at "normal" weather. Typically they do so by developing a linear fit between usage and weather and applying that fitted model to normalized weather. Those equations could be used in theory to calculate individual changes in energy efficiency. However, the accuracy of this method is not sufficient for these calculations. The Prism approach attempts to overcome this deficiency by the inclusion of a household specific variable tau. However, the Prism model effectively forces all households into the same equation structure of a linear regression. Prism also calculates a normal annual consumption in its determination of efficiency, and does not use the current weather condition to determine efficiency at that weather condition. The present invention chooses the optimal model structure for each consumer. The Prism approach develops a baseline and a non-baseline model for each consumer and exercises both models on normalized weather. The Prism approach is thus subject to numerous shortcomings including model inaccuracy far exceeding the change in normal consumption and errors caused by non-constant period lengths that can obscure the changes in efficiency.

An automated system and method for calculating changes in the energy efficiency of retail consumers of energy and reporting to those consumers the results and ramifications of those changes is needed such that the transaction cost of providing this information to retail consumers will be reduced such that it will be cost effective.

Using the present invention retail consumers can see the results of their behavioral changes such as resetting their thermostats, purchasing more energy efficient products such as sub-compact fluorescent light bulbs, high efficiency heating and cooling units and EnergyStar® compliant electronics and home-improvement projects such as installing additional insulation, stopping air leaks and installing storm doors and windows. Retail consumers will enjoy the same benefits currently available only to large commercial, governmental and industrial consumers through expensive, labor-intensive processes.

Efficiency changes in the context of the present invention are defined as changes to the whole consumption pattern related to a physical structure such as a house, apartment or commercial establishment. Efficiency includes considerations of equipment, consumer behavior and the physical aspects of the structure and space within.

Thus, there is a need for a system and method of measuring changes in energy efficiency for individual energy consumers at the retail customer level and reporting the results of that measurement to those consumers. In addition, there is a need for better reporting of individual and aggregate energy efficiency changes to utilities and third parties such as energy suppliers, regulators and other governmental agencies.

SUMMARY OF THE INVENTION

The present invention is directed to a method of receiving, processing and reporting data regarding retail consumers' energy usage and weather in large batches. For each group of energy usage data to be processed, accurate historic weather data for multiple weather stations must be acquired. Weather data received may include Heating Degree Days, Cooling Degree Days, Relative Humidity, Dew point, Atmospheric Pressure and Precipitation. These data may be transmitted over a communication link such as, for example, the Internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution.

The data received for each weather station may be missing some data points or contain gross inaccuracies. The present invention detects missing or grossly inaccurate data points and correctly "fills" the data using a variety of algorithms including but not limited to regressions, average replacements, deltas off of adjacent weather stations, deltas off of prior points, average prior and subsequent point and strategic estimates.

Each batch of energy usage data to be processed includes electronic data regarding anywhere from, for example, a few thousand to several million individual retail consumers. For each consumer, data regarding, for example, up to 24 months of usage is included. Data for each usage period for each consumer may include individual consumer record keys such as account number, sufficient location information to identify the appropriate weather station, consumption information including meter read data and dates, type of meter read which may include actual, estimate, correction and other billing information. In addition, contact information such as name, address and phone number may be included for reporting purposes.

The energy usage data (consumption in volumes of fuel such as gallons, MCF's, and pounds, etc., or energy units such as kWh, therms, BTU's, etc.) with related information about the periods of consumption such as starting date and number of days in a period, ending date and number of days in a period, starting and ending dates or a series of days in a period with a beginning or ending offset sufficient to determine the starting and ending dates of each consumption period received from, for example, the utility or energy supplier, may contain known data structure problems such as overlapping or missing meter read periods, invalid dates, such as February 30, invalid years such as 1901 appearing in a data set containing 2001 data, bad estimates, bad meter reads and accounting corrections, including those previously mentioned, and cancels and rebills. The present invention examines the data for these and other problems and repairs or removes problematic data elements using a variety of algorithms including but not limited to artificial intelligence, regression technology, analysis of variance, outlier analysis and human inspection.

The present invention examines the cleaned data for a baseline period and develops individual mathematical baseline models representing usage patterns for each consumer. The models may include but are not required to use or limited to the analysis of base non-weather related use, usage sensitive to changes in weather, temperatures at which the consumer turns on or off their heating and/or cooling systems, humidity, precipitation, wind speed, cloud cover, and trend variables.

The present invention then exercises the baseline models for each consumer using data representing actual weather that occurred in a period subsequent or prior to the baseline period to determine each consumer's Actual Weather Consumption Estimate (AWCE). An alternate method is to develop a baseline and a non-baseline model for each consumer and to exercise both models over a consistent period of either actual or normalized weather.

Additional usage data for the individual consumers are received from, for example, the utility or energy supplier. These data correspond to the same period for which the AWCE has been calculated. Alternately these data may be received with the original data set.

The present invention then compares the AWCE to the actual usage in the same period to determine changes in the consumer's energy usage patterns. The changes detected may be caused by changes in equipment, additions or removal of equipment such as replacing existing appliances with more efficient models or by consumer behavior changes such as changing thermostat settings, turning off unused equipment or limiting use of inefficient equipment.

The present invention prepares data to be reported to the consumer in an easy-to-understand format. Such information may include the quantity of energy used that is greater or less than the AWCE and the value of that energy usage in dollars. Additional information may be prepared including the environmental impact of the consumer's energy efficiency change such as the pounds of emissions avoided or caused, the quantity of raw materials saved or used as a result of the consumer's energy efficiency change and the societal impact such as the additional generation facilities needed or avoided by the energy efficiency change. This information is from average parameters related to the specific fuel consumed based on an industry, state or utility system. Further information may be provided to the consumer regarding recommendations for energy efficiency improvements and the potential benefit of those improvements.

Aggregate results at the utility, state or national level may also be included so the consumer may compare their personal results to those of a larger group.

The present invention includes a quality assurance method that randomly pulls a sample of individual consumer calculations to be compared to a hand calculation performed by the system operator or parallel operation performed by a second system. In addition, issues that are missed in the data cleanup may be determined at this stage. A system of prescribed reality checks using tests of known ratio ranges also are used to detect problems with modeling or data cleaning. The quality assurance step is important and should not be avoided. This step is crucial in establishing credibility with consumers and other interested parties such as regulators, legislators and utilities.

The present invention includes methods of communicating results of the energy efficiency change calculation to the individual consumers, the utility, and any other interested parties. These methods may include but are not limited to transmission of data over a communication link such as, for example, the Internet, public databases, telephone lines or by computer readable media such as, for example, magnetic or optical storage media. Distribution can also be accomplished by distribution to a central storage site on the public Internet, intranet, a local area network (LAN), a wide area network (WAN) or a direct connection for further access or distribution. Further communication methods to consumers may include direct mail, telephone communications, e-mail, personal visits, facsimile and public communications such as radio and TV broadcasting or billboards.

The message communicated to each consumer may take the form of an energy efficiency index, a percentage change in energy efficiency, actual quantity of energy efficiency variance, the dollar value of energy efficiency variance and values that may be inferred from the energy efficiency variance such as quantities or percentages of pollutants created or avoided. This information may be presented as a bar chart or a graph in addition to the stated numbers.

BRIEF DESCRIPTION OF THE DRAWING

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, other elements found in a typical computer system. For example, specific operating system details and modules and specific database management details and modules are not shown. Those of ordinary skill in the art will recognize that other elements may be desirable to produce an operational system incorporating the present invention. However, because such elements are well known in the art, and because they do not facilitate a better understanding of the present invention, a discussion of such elements is not provided herein.

Figure 1:
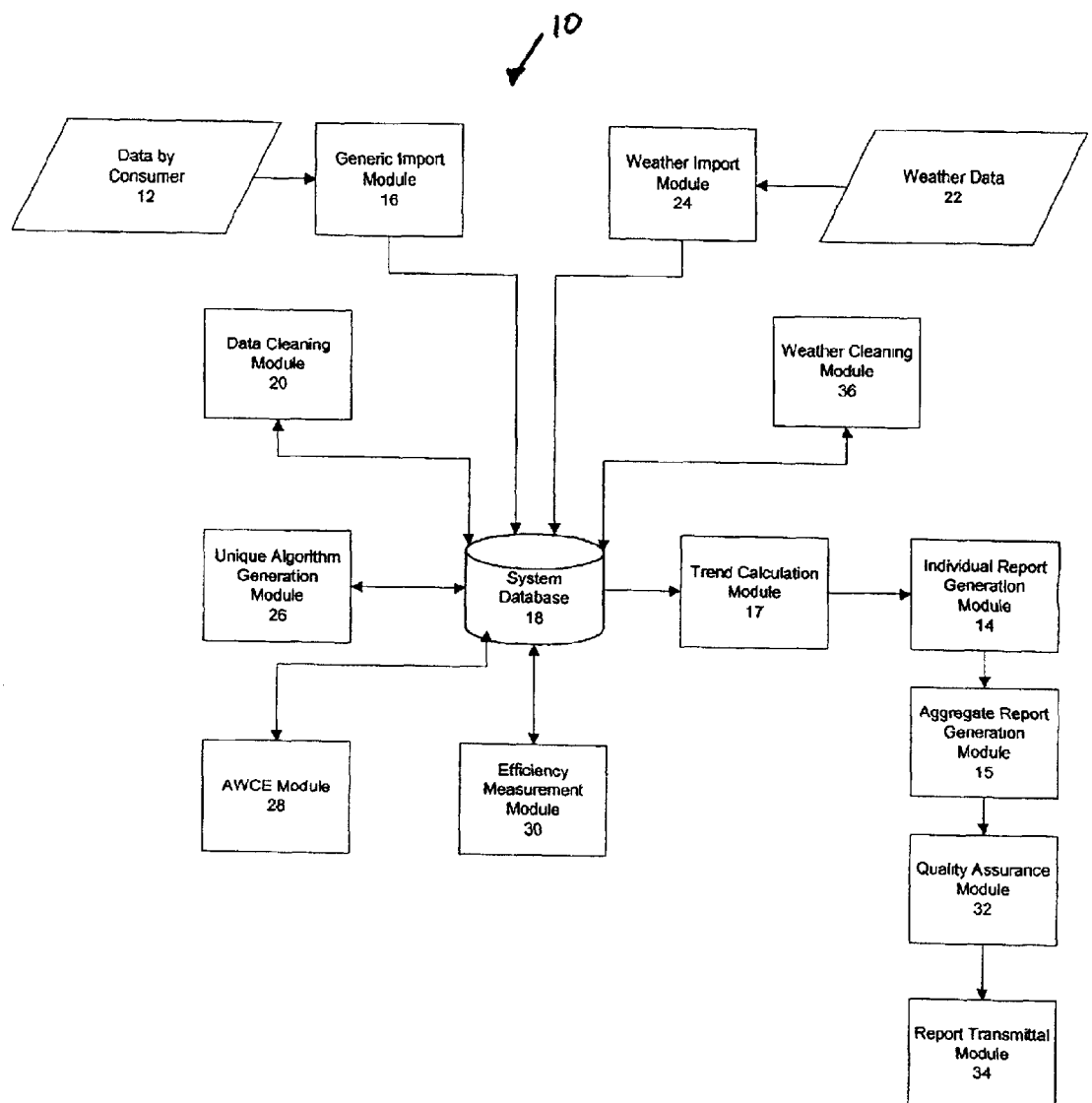
FIG. 1 is a diagram illustrating the energy efficiency measurement system and reporting system of the present invention.

FIG. 1 is a diagram illustrating an energy efficiency measurement system and reporting system 10 of the present invention. Usage data 12 contained within a database for individual consumers or provided by individual consumers are transmitted over a communication link such as, for example, the Internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution. Data transmitted for large numbers of consumers are likely to include individual consumer record keys such as account number, consumption information including meter read data and dates, type of meter read which may include actual, estimate, correction and other billing information. In addition, contact information such as name, address and phone number may be included for a Individual Report Generation Module 14. Additional information may be required such as conversion factors from energy units to alternate energy units or dollars. This data transmission may occur at one time or many times throughout the process.

Generic Import Module 16 accepts the usage data 12 and imports the data 12 into the appropriate positions in a System Database 18.

Data Cleaning Module 20 examines the data for known data structure problems such as overlapping meter read periods, invalid dates, bad estimates, bad meter reads and accounting corrections including those previously mentioned and cancels and rebills. In addition, the Data Cleaning Module 20 repairs or removes problematic data elements.

Weather data 22 are transmitted over a communication link such as, for example, the Internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution. Weather data 22 received may include Heating Degree Days, Cooling Degree Days, Relative Humidity, Dew point, Atmospheric Pressure, Precipitation, Wind Speed and Cloud Cover Percentage.

Weather Import Module 24 accepts the weather data 22 and imports them into appropriate positions in the System Database 18.

Weather Cleaning Module 36 examines the weather data for known data structure problems such as invalid dates or missing data. The Module 36 may also adjust for changing weather station data that are not consistent over time. The present invention fills missing data points using methods which may include but are not limited to averaging, regression, interpolation between neighboring weather stations, application of normals and application of known biases to data from neighboring stations.

Unique Algorithm Generation Module 26 examines the cleaned data for a base period and develops individual mathematical baseline models representing usage patterns for each consumer. Each model may include but is not limited to analysis of base non-weather related use, usage sensitive to changes in weather, temperatures at which the consumer turns on or off their heating and/or cooling systems and trend variables. The present invention works with a single algorithm in place of the Unique Algorithm Generation Module 26 with a significantly lower level of accuracy.

AWCE Module 28 exercises the baseline model for each consumer using data representing actual weather that occurred in a period subsequent or prior to the base period to determine each consumer's Actual Weather Consumption Estimate (AWCE).

Figure 3:
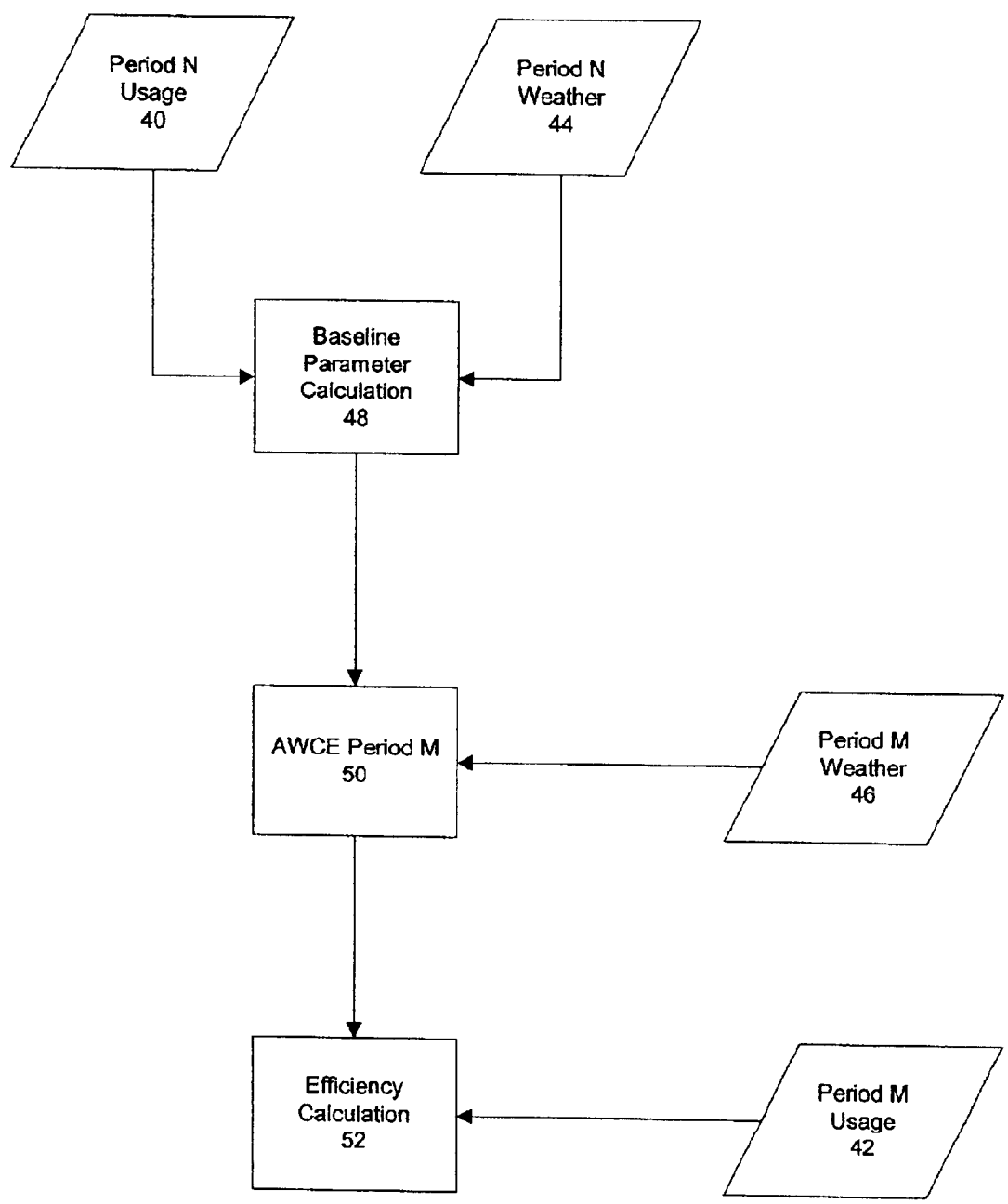
FIG. 3 is a diagram illustrating an embodiment of a process flow of an efficiency calculation.
Figure 4:
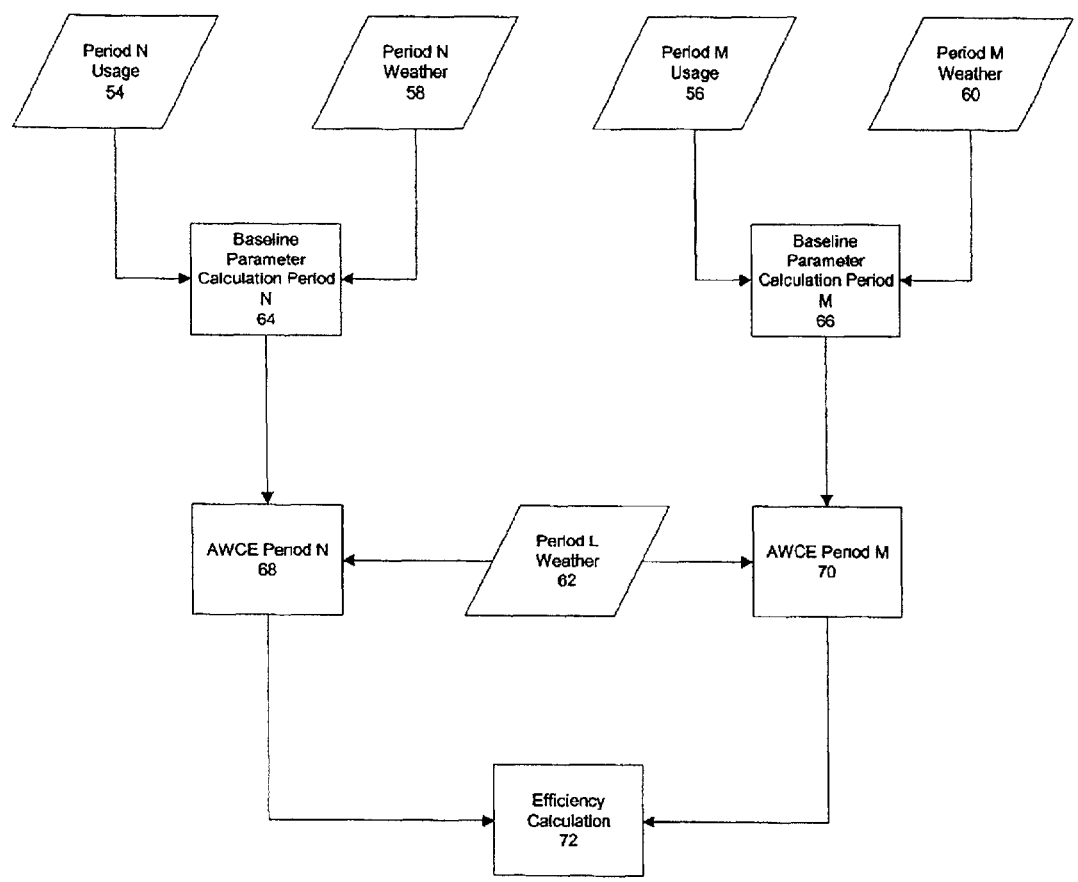
FIG. 4 is a diagram illustrating another embodiment of the process flow of the efficiency calculation.

Efficiency Measurement Module 30 compares the AWCE to the actual usage in the same subsequent or prior period to determine changes in the consumer's energy usage patterns. The changes detected may be caused by load growth, by changes in equipment such as replacing existing appliances with more efficient models or by consumer behavior changes such as changing thermostat settings, turning off unused equipment or limiting use of inefficient equipment. Embodiments of the flow from import of consumer information and weather data through the efficiency calculation is shown in FIGS. 3 and 4. The results of execution of Module 30 are stored in the System Database 18.

Trend Calculation Module 17 retrieves all stored results of Efficiency Measurement Module 30 for each customer and prepares a trend analysis for that customer. The analysis may include but is not limited to compounding percentage changes in efficiency, averaging percentage changes in efficiency, and summing absolute changes in fuel usage. In an alternative embodiment, Module 17 may be exercised using stored individual consumer algorithms from many consumption periods to produce an efficiency trend. In this case, the functions described in FIG. 3 or FIG. 4 may be executed multiple times in order to determine a trend in energy efficiency changes.

Individual Report Generation Module 14 prepares data to be reported to the consumer in an easy-to-understand format. The data may include the quantity of energy used that is greater or less than the AWCE and the value of that energy usage in dollars. These data may be presented as a percentage difference or an absolute difference. Additional information may be prepared including the environmental impact of the consumer's energy efficiency change such as the pounds of emissions avoided or caused, the quantity of raw materials saved or used as a result of the consumer's energy efficiency change and the societal impact such as the additional generation facilities needed or avoided by the energy efficiency change. A trend in the consumer's energy efficiency changes may be included in the report. Aggregate results at the utility, state or national level may also be included so the consumer may compare their personal results to those of a larger group.

Aggregate Report Generation Module 15 aggregates the individual energy efficiency changes and prepares summary reports to be reported to the utilities and other interested parties such as regulators and other governmental agencies. These summary results may include but are not limited to the statistical distributions of individual parameters such as percent change in energy efficiency, expected change in energy usage at different temperatures, and aggregate totals and averages by different reference parameters such as zip code, distribution system, geographical location, weather station, and customer type. The aggregate results may be grouped by one or more reference groups such as by zip code, town, weather station and customer type. A reference comparison may be provided between the individual results and one or more reference groups.

Quality Assurance Module 32 executes methods of quality control to assure the accuracy of calculations and output. The module 32 randomly pulls a sample of individual consumer calculations to be compared to a hand calculation performed by the system operator or parallel operation performed by a second system. In addition, issues that are missed in the data cleanup may be determined at this stage. A system of prescribed reality checks using tests of known ratio ranges also are used to detect problems with modeling or data cleaning. This step is important in establishing credibility with consumers and other interested parties such as regulators, legislators and utilities. Module 32 also ensures that each input record is accounted for and ensures data integrity through the Report Transmittal Module 34.

Report Transmittal Module 34 executes methods of communicating the output from Individual Report Generation Module 14 to the individual consumers and the utility or other interested parties such as regulators or other governmental agencies. These methods may include but are not limited to transmission of data over a communication link such as, for example, the Internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution. Further communication methods to consumers may include direct mail, telephone communications, e-mail, personal visits, facsimile and public communications such as radio and TV broadcasting or billboards.

Figure 2:
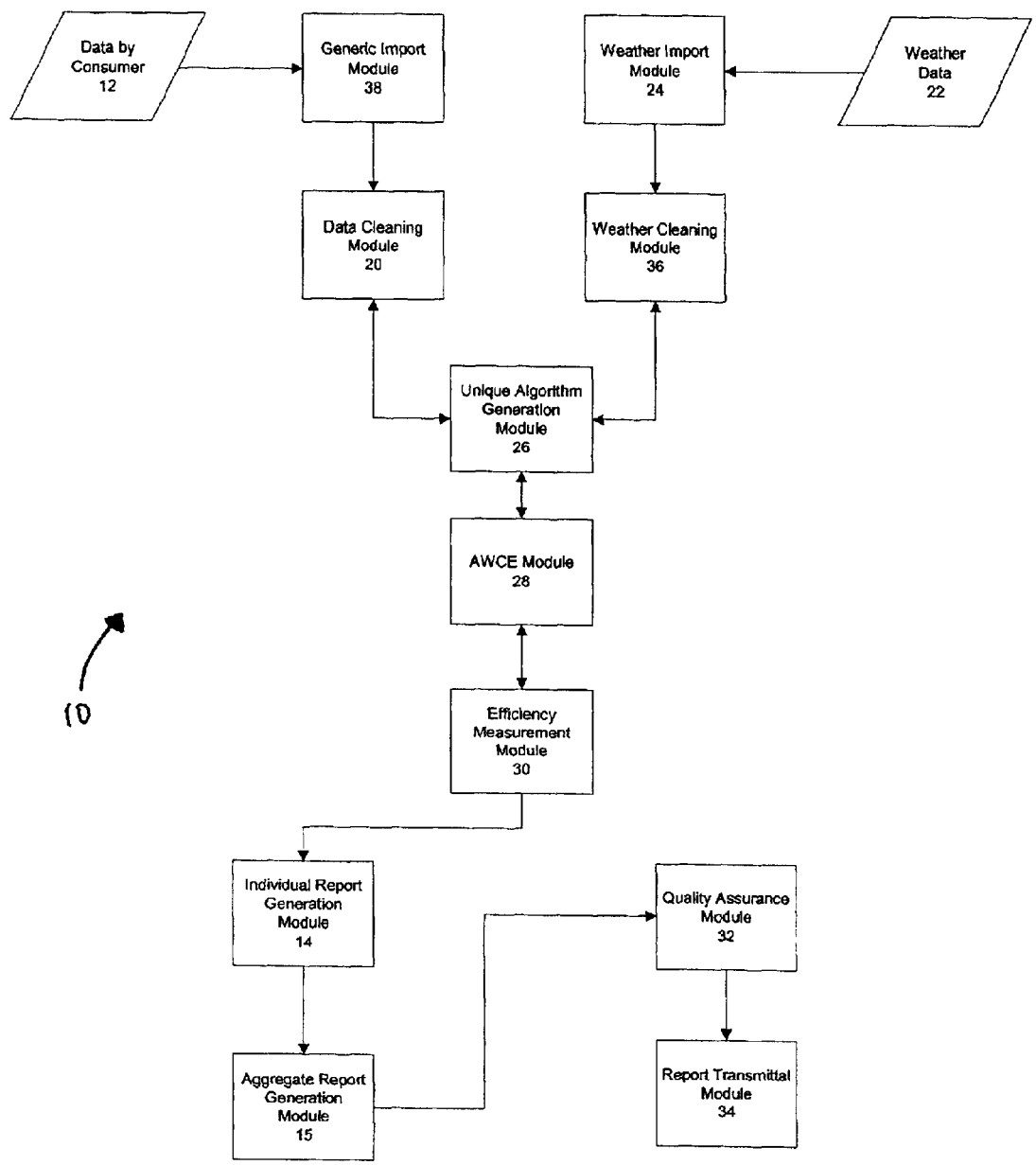
FIG. 2 is a diagram illustrating another embodiment of the energy efficiency measurement system and reporting system of the present invention that does not utilize a system database.

FIG. 2 is a diagram illustrating another embodiment of the energy efficiency measurement system and reporting system 10 of the present invention that does not utilize a system database. Usage data 12 contained within a database for individual consumers or collected from individual consumers are transmitted over a communication link such as, for example, the internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution. Data transmitted for large numbers of consumers are likely to include individual consumer record keys such as account number, consumption information including meter read data and dates, type of meter read which may include actual, estimate, correction and other billing information. In addition, contact information such as name, address and phone number may be included for Individual Report Generation Module 14. Additional information may be required such as conversion factors from energy units to alternate energy units or dollars. This data transmission may occur at one time or many times throughout the process.

Generic Import Module 38 accepts the usage data and imports it into the memory of the computer.

Data Cleaning Module 20 examines the data for known data structure problems such as overlapping meter read periods, invalid dates, bad estimates, bad meter reads and accounting corrections including those previously mentioned and cancels and rebills. In addition, the Data Cleaning Module 20 repairs or removes problematic data elements.

Weather Data 22 transmitted over a communication link such as, for example, the Internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution. Weather data received may include Heating Degree Days, Cooling Degree Days, Relative Humidity, Dew point, Atmospheric Pressure, Precipitation, Wind Speed and Cloud Cover Percentage.

Weather Import Module 24 accepts the weather data and imports them into the memory of the computer. Weather Cleaning Module 36 examines the weather data for known data structure problems such as invalid dates or missing data. The present invention fills missing data points using methods which may include but are not limited to averaging, regression, interpolation between neighboring weather stations, application of normals and application of known biases to data from neighboring stations.

Unique Algorithm Generation Module 26 examines the cleaned data for a base period and develops individual mathematical baseline models representing usage patterns for each consumer. The model may include but is not limited to analysis of base non-weather related use, usage sensitive to changes in weather, temperatures at which the consumer turns on or off their heating and/or cooling systems and trend variables. The present invention works with a single algorithm in place of the Unique Algorithm Generation Module 26 with a significantly lower level of accuracy.

AWCE Module 28 exercises the baseline model for each consumer using data representing actual weather that occurred in a period subsequent or prior to the base period to determine each consumer's Actual Weather Consumption Estimate (AWCE).

Efficiency Measurement Module 30 compares the AWCE to the actual usage in the same subsequent or prior period to determine changes in the consumer's energy usage patterns. The changes detected may be caused by load growth, by changes in equipment such as replacing existing appliances with more efficient models or by consumer behavior changes such as changing thermostat settings, turning off unused equipment or limiting use of inefficient equipment. Embodiments of the flow from import of consumer information and weather data through the efficiency calculation is shown in FIGS. 3 and 4.

Individual Report Generation Module 14 prepares data to be reported to the consumer in an easy-to-understand format. The data may include the quantity of energy used that is greater or less than the AWCE and the value of that energy usage in dollars. These data may be presented as a percentage difference as an absolute difference. Additional information may be prepared including the environmental impact of the consumer's energy efficiency change such as the pounds of emissions avoided or caused, the quantity of raw materials saved or used as a result of the consumer's energy efficiency change and the societal impact such as the additional generation facilities needed or avoided by the energy efficiency change. Aggregate results at the utility, state or national level may also be included so the consumer may compare their personal results to those of a larger group.

Aggregate Report Generation Module 15 aggregates the individual energy efficiency changes and prepares summary reports to be reported to the utilities and other interested parties such as regulators and other governmental agencies. These summary results may include but are not limited to the statistical distributions of individual parameters such as percent change in energy efficiency, expected change in energy usage at different temperatures, and aggregate totals and averages by different reference parameters such as zip code, distribution system, geographical location, weather station, customer type. The aggregate results may be grouped by one or more reference groups such as zip code, town, weather station and customer type. A reference comparison may be provided between the individual results and one or more reference groups.

Quality Assurance Module 32 executes methods of quality control to assure the accuracy of calculations and output.

The module 32 randomly pulls a sample of individual consumer calculations to be compared to a hand calculation performed by the system operator. In addition, issues that are missed in the data clean up may be determined at this stage. A system of prescribed reality checks using tests of known ratio ranges also are used to detect problems with modeling or data cleaning. This step is important in establishing crucial in establishing credibility with consumers and other interested parties such as regulators, legislators and utilities. Module 32 also ensures that each input record is accounted for and ensures data integrity through the Report Transmittal Module 34.

Report Transmittal Module 34 executes methods of communicating the output from Individual Report Generation Module 14 and Aggregate Report Generation Module 15 to the individual consumers and to the utility or other interested parties such as regulators or other governmental agencies. These methods may include but are not limited to transmission of data over a communication link such as, for example, the Internet, telephone lines or by computer readable media such as, for example, magnetic or optical storage media. Distribution can also be accomplished by distribution to a central storage site on the public Internet, an intranet, a local area network (LAN), a wide area network (WAN) or a direct connection for further access or distribution. Further communication methods to consumers may include direct mail, telephone communications, e-mail, personal visit, facsimile and public communications such as radio and TV broadcasting or billboards.

Although FIG. 2 does not include a Trend Calculation Module 15, a trend calculation may be performed similarly to that described hereinabove in conjunction with FIG. 1. However, a database would be necessary to store individual algorithms or efficiencies if a long-time series of consumption data is not input. If a long-time series of data is input, sequential calculations could be performed to determine efficiency trend inputs.

FIGS. 1 and 2 illustrate the system 10 both with and without the system database 18. However, it can be understood that a database (whether the system database 18 or other database(s)) may be used for any of the calculations and reporting functions performed by the system 10.

FIG. 3 is a diagram illustrating an embodiment of a process flow of an efficiency calculation. A given period's (Period N) Usage 40 and another given period's (Period M) Usage 42 are Data 12 by Consumer from Utility that have been imported using the Generic Import Module 16, 38 and processed by Data Cleaning Module 20. A given period's (Period N) Weather 44 and another given period's (Period M) Weather 46 are Weather Data 22 that have been imported using the Weather Import Module 24 and processed by Weather Cleaning Module 36. All data may be either stored in the System Database 18 or maintained in the memory of the computer.

Baseline Parameter Calculation 48 includes methods of deploying Unique Algorithm Generation Module 26 for each consumer to determine a baseline model of usage for that consumer.

AWCE Period M 50 includes methods of calculating each customer's Actual Weather Consumption Estimate (AWCE) by exercising the baseline model for each consumer using data representing actual weather during the period representing Period M Weather 46.

Efficiency Calculation 52 includes methods of comparing AWCE Period M 50 to Period M Usage 42 and calculating the percent change in efficiency for each consumer. If Period M is subsequent to Period N, the calculation is any mathematical equivalent to (Period M Usage 42 divided by AWCE Period M 50) minus one. If Period N is subsequent to Period M, the calculation is any mathematical equivalent to (AWCE Period M 50 divided by Period M Usage 42) minus one. If the result is greater than zero, it represents a percentage decrease in efficiency. If the result is less than zero, it represents a percentage increase in efficiency.

FIG. 4 is a diagram illustrating another embodiment of the process flow of the efficiency calculation. A given period's (Period N) Usage 54 and another given period's (Period M) Usage 56 are Data 12 by Consumer from Utility that have been imported using the Generic Import Module 16, 38 and processed by Data Cleaning Module 20. A given period's (Period N) Weather 58, another given period's (Period M) Weather 60 and another given period's (Period L) Weather 62 are Weather Data 22 that have been imported using the Weather Import Module 24 and processed by Weather Cleaning Module 36. All data may be either stored in the System Database 18 or maintained in the memory of the computer. Period L may be prior, subsequent or concurrent to Period M. For example Period L may represent actual weather in a cold period, a warm period, an average period, a hypothetical or a normalized period. The use of normalized weather is similar to the Prism method and only imparts a portion of the information capable of being provided by this model.

Baseline Parameter Calculation Period N 64 includes methods of deploying Unique Algorithm Generation Module 26 for each consumer to determine a baseline model of usage for that consumer for Period N.

Baseline Parameter Calculation Period M 66 includes methods of deploying Unique Algorithm Generation Module 26 for each consumer to determine a baseline model of usage for that consumer for Period M.

AWCE Period N 68 includes methods of calculating each customer's Actual Weather Consumption Estimate (AWCE) by exercising the baseline model for each consumer using data representing actual weather during the period representing Period L Weather 62.

AWCE Period M 70 includes methods of calculating each customer's Actual Weather Consumption Estimate (AWCE) by exercising the baseline model for each consumer using data representing actual weather during the period representing Period L Weather 62.

Efficiency Calculation 72 includes methods of comparing AWCE Period M 68 to AWCE Period M 70 and calculating the percent change in efficiency for each consumer. If Period M is subsequent to Period N, the calculation is any mathematical equivalent to (AWCE Period M 70 divided by AWCE Period M 68) minus one. If Period N is subsequent to Period M, the calculation is any mathematical equivalent to (AWCE Period M 68 divided by AWCE Period M 70) minus one. If the result is greater than zero, it represents a percentage decrease in efficiency. If the result is less than zero, it represents a percentage in crease in efficiency.

Although the present invention has been described herein with reference to certain embodiments, numerous modifications and variations can be made and still the result will come within the scope of the invention. No limitation with respect to the specific embodiments disclosed herein is intended or should be inferred.

We claim:

1. A method of providing energy efficiency changes to a plurality of energy consumers, comprising:

calculating the energy efficiency changes for the consumers based on energy consumption histories and weather data, wherein the energy efficiency changes are calculated using individual data for each of the consumers, wherein the energy efficiency changes represent changes to an entire consumption pattern related to at least one physical structure, and wherein the energy efficiency changes include considerations of at least one of equipment, consumer behavior, and physical aspects of the physical structure and spaces within the physical structure; and reporting the energy efficiency changes to each of the consumers.

2. The method of claim 1, wherein reporting the energy efficiency changes to each of the consumers includes reporting the energy efficiency changes to each of the consumers on an individual basis.

3. The method of claim 1, wherein reporting the energy efficiency changes to each of the consumers includes reporting the energy efficiency changes to each of the consumers on an aggregate basis.

4. The method of claim 1, wherein reporting the energy efficiency changes to each of the consumers includes reporting the energy efficiency changes to each of the consumers on an individual basis as compared to an aggregate.

5. The method of claim 1, wherein calculating the energy efficiency changes includes calculating the energy efficiency changes for the consumers based on prior and subsequent period weather data and consumption histories.

6. The method of claim 1, wherein reporting the energy efficiency to each of the consumers includes reporting the energy efficiency changes to each of the consumers using at least one of the Internet, an intranet, a computer-readable medium, direct mail, telephone, electronic mail, in-person visits, and facsimile.

7. The method of claim 5, further comprising calculating the consumption histories based on data that are cleaned using cleaning algorithms and human intervention.

8. The method of claim 5, further comprising assuring the quality of the energy efficiency changes using hand calculations and analysis.

9. The method of claim 8, wherein assuring the quality includes using normal ratios to test a reasonableness of the energy efficiency changes.

10. An energy efficiency measurement and reporting system, comprising:

a generic import module for receiving consumer data;

a weather import module for receiving weather data;

a unique algorithm generation module in communication with the generic import module and the weather import module;

an actual weather consumption estimate module in communication with the unique algorithm generation module;

an efficiency measurement module in communication with the actual weather consumption estimate module, wherein the efficiency measurement module calculates energy efficiency changes for a plurality of energy consumers based on energy consumption histories and the weather data, wherein the energy efficiency changes are calculated using individual data for each of the consumers, wherein the energy efficiency changes represent changes to an entire consumption pattern related to at least one physical structure, and wherein the energy efficiency changes include considerations of at least one of equipment, consumer behavior, and physical aspects of the physical structure and spaces within the physical structure; and an individual report generation module in communication with the efficiency measurement module.

11. The system of claim 10, further comprising:

a data cleaning module in communication with the generic import module; and a weather cleaning module in communication with the weather import module.

12. The system of claim 10, further comprising a quality assurance module in communication with the individual report generation module.

13. The system of claim 10, further comprising an aggregate report generation module in communication with the individual report generation module.

14. The system of claim 12, further comprising a report transmittal module in communication with the quality assurance module.

15. An energy efficiency measurement and reporting system, comprising:

a generic import module for receiving consumer data;

a weather import module for receiving weather data;

a system database in communication with the generic import module and the weather import module;

a unique algorithm generation module in communication with the system database;

an actual weather consumption estimate module in communication with the system database;

an efficiency measurement module in communication with the system database, wherein the efficiency measurement module calculates energy efficiency changes for a plurality of energy consumers based on energy consumption histories and the weather data, wherein the energy efficiency changes are calculated using individual data for each of the consumers, wherein the energy efficiency changes represent changes to an entire consumption pattern related to at least one physical structure, and wherein the energy efficiency changes include considerations of at least one of equipment, consumer behavior, and physical aspects of the physical structure and spaces within the physical structure; and an individual report generation module in communication with the system database.

16. The system of claim 15, further comprising:

a data cleaning module in communication with the system database; and a weather cleaning module in communication with the system database.

17. The system of claim 15, further comprising a quality assurance module in communication with the individual report generation module.

18. The system of claim 15, further comprising a trend calculation module in communication with the system database and the individual report generation module.

19. The system of claim 17, further comprising a report transmittal system in communication with the quality assurance module.

20. The system of claim 17, further comprising an aggregate report generation module in communication with the individual report generation module and the quality assurance module.

21. A computer-readable medium having stored thereon instructions which, when executed by a processor, cause the processor to perform the steps of:

calculating energy efficiency changes for a plurality of energy consumers based on energy consumption histories and weather data, wherein the energy efficiency changes are calculated using individual data for each of the consumers, wherein the energy efficiency changes represent changes to an entire consumption pattern related to at least one physical structure, and wherein the energy efficiency changes include considerations of at least one of equipment, consumer behavior, and physical aspects of the physical structure and spaces within the physical structure; and reporting the energy efficiency changes to each of the consumers.

22. A method of providing energy efficiency changes to a plurality of energy consumers, comprising:

calculating a plurality of prior and subsequent period consumption histories based on data that are cleaned using cleaning algorithms and human intervention;

calculating the energy efficiency changes for the consumers based on prior and subsequent period weather data and the prior and subsequent period consumption histories, wherein the energy efficiency changes are calculated using individual data for each of the consumers; and reporting the energy efficiency changes to each of the consumers.

23. A method of providing energy efficiency changes to a plurality of energy consumers, comprising:

calculating the energy efficiency changes for the consumers based on prior and subsequent period weather data and prior and subsequent period consumption histories, wherein the energy efficiency changes are calculated using individual data for each of the consumers;

assuring the quality of the energy efficiency changes using hand calculations and analysis; and reporting the energy efficiency changes to each of the consumers.

24. The method of claim 23, wherein assuring the quality includes using normal ratios to test a reasonableness of the energy efficiency changes.

25. An energy efficiency measurement and reporting system, comprising:

a generic import module for receiving consumer data;

a weather import module for receiving weather data;

a unique algorithm generation module in communication with the generic import module and the weather import module;

an actual weather consumption estimate module in communication with the unique algorithm generation module;

an efficiency measurement module in communication with the actual weather consumption estimate module, wherein the efficiency measurement module calculates energy efficiency changes for a plurality of energy consumers based on energy consumption histories and the weather data, and wherein the energy efficiency changes are calculated using individual data for each of the consumers;

an individual report generation module in communication with the efficiency measurement module; and a quality assurance module in communication with the individual report generation module.

26. The system of claim 25, further comprising a report transmittal module in communication with the quality assurance module.

27. An energy efficiency measurement and reporting system, comprising:

a generic import module for receiving consumer data;

a weather import module for receiving weather data;

a system database in communication with the generic import module and the weather import module;

a unique algorithm generation module in communication with the system database;

an actual weather consumption estimate module in communication with the system database;

an efficiency measurement module in communication with the system database, wherein the efficiency measurement module calculates energy efficiency changes for a plurality of energy consumers based on energy consumption histories and the weather data, and wherein the energy efficiency changes are calculated using individual data for each of the consumers;

an individual report generation module in communication with the system database; and a quality assurance module in communication with the individual report generation module.

28. The system of claim 27, further comprising an aggregate report generation module in communication with the individual report generation module and the quality assurance module.

* * * * *